US009240295B2

(12) United States Patent
Choo et al.

(10) Patent No.: US 9,240,295 B2
(45) Date of Patent: Jan. 19, 2016

(54) LOW EMI KEYPAD CIRCUITRY

(75) Inventors: Hong Chean Choo, Singapore (SG); Kien Beng Tan, Singapore (SG); Gee Heng Loh, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 1122 days.

(21) Appl. No.: 13/233,214

(22) Filed: Sep. 15, 2011

(65) Prior Publication Data

US 2013/0069805 A1 Mar. 21, 2013

(51) Int. Cl.
*H03K 17/94* (2006.01)
*H03M 11/00* (2006.01)
*H03K 17/62* (2006.01)
*H01H 13/70* (2006.01)

(52) U.S. Cl.
CPC ......... *H01H 13/70* (2013.01); *H01H 2239/004* (2013.01); *H01H 2239/01* (2013.01)

(58) Field of Classification Search
USPC ............................ 340/2.28; 341/26; 178/103
See application file for complete search history.

(56) References Cited

U.S. PATENT DOCUMENTS 4,633,228 A * 12/1986 Larson ............................ 341/26
4,918,445 A 4/1990 Bower
7,151,432 B2 * 12/2006 Tierling ...................... 340/2.28
7,363,063 B2 * 4/2008 Zhu et al. .................. 455/575.1
8,274,411 B2 * 9/2012 Trattler .......................... 341/26

* cited by examiner

*Primary Examiner* — Firmin Backer
*Assistant Examiner* — Jerold Murphy
(74) *Attorney, Agent, or Firm* — Gardere Wynne Sewell LLP

(57) ABSTRACT

Disclosed is keypad circuitry operable to detect a pressed key while reducing electromagnetic interference (EMI). The keypad circuitry is operable to reduce EMI in two ways: a) reducing the voltage swing occurring at the row circuitry and column circuitry of the keypad, and b) reducing the number of signal transitions by restricting the signal transitions to occurring at the column and row corresponding to a pressed key. By limiting signal transitions to occurring only at the row and column corresponding to a pressed key, fewer signal transitions occur, and thus, less EMI is produced. Additionally, reduced voltage swings at the row circuitry and column circuitry results in reduced EMI.

26 Claims, 8 Drawing Sheets

LOW EMI KEYPAD CIRCUITRY

BACKGROUND

1. Technical Field

The present invention relates generally to circuitry for detecting keypad input and, more specifically, to keypad circuitry operable to identify a pressed key while reducing electromagnetic interference (EMI).

2. Introduction

Conventional keypad circuitry generally comprises a matrix of keys with each key being defined by an intersection of a row and a column, wherein the conventional circuitry performs a key scan to detect and identify a pressed key. An example of such conventional keypad circuitry is disclosed in U.S. Pat. No. 4,918,445, the disclosure of which is hereby incorporated by reference. In the example conventional keypad circuitry, the columns initially function as drivers and the rows initially function as inputs, wherein pull-up circuitry functions to force all row inputs to a logic low value. When a key is pressed, the column driver corresponding to the pressed key is connected to the input of the row corresponding to the pressed key, thereby applying a voltage to the row input and changing the corresponding row input to a logic high value. When the logic high is detected on any of the rows, the columns are changed to inputs and the row corresponding to the pressed key is changed to a driver. The columns, which are now functioning as inputs, are read to detect the column corresponding to the pressed key. When the row and column corresponding to the pressed key are detected, the pressed key is thereby identified.

Operations performed by the conventional keypad circuitry produce a significant amount of electromagnetic interference (EMI). For example, when determining which key is pressed, a signal transition occurs at each of the columns and rows, and the conventional keypad circuitry performs a scan of all the column drivers as well as a scan of all the rows to detect the signal transitions. Additionally, a rail-to-rail voltage swing occurs when the column driver is connected to the input of the row. The rail-to-rail voltage swing and signal transitions of the columns and rows produces EMI, which may cause premature failure or otherwise degrade performance of the keypad circuitry. As such, there exists a need for keypad circuitry capable to identify a pressed key while reducing electromagnetic interference.

SUMMARY

The present disclosure provides for keypad circuitry capable of detecting a pressed key while reducing electromagnetic interference (EMI). The keypad circuitry comprises: a plurality of first signal lines; a plurality of second signal lines crossing the plurality of first signal lines; a plurality of keys, each key operable to connect one of the first signal lines to one of the second signal lines; and a clamping circuit coupled to each of the first signal lines. In one embodiment, the disclosed keypad circuitry reduces EMI by reducing a voltage swing occurring on the first and second signal lines. In another embodiment, the keypad circuitry reduces EMI by a) reducing the voltage swing occurring on the first and second signal lines, and b) reducing the number of signal transitions by restricting the signal transitions to occurring at connected first and second signal lines.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures not drawn to scale, in which like reference numbers indicate similar parts, and in which.

DETAILED DESCRIPTION OF THE DRAWINGS

Figure 1A:
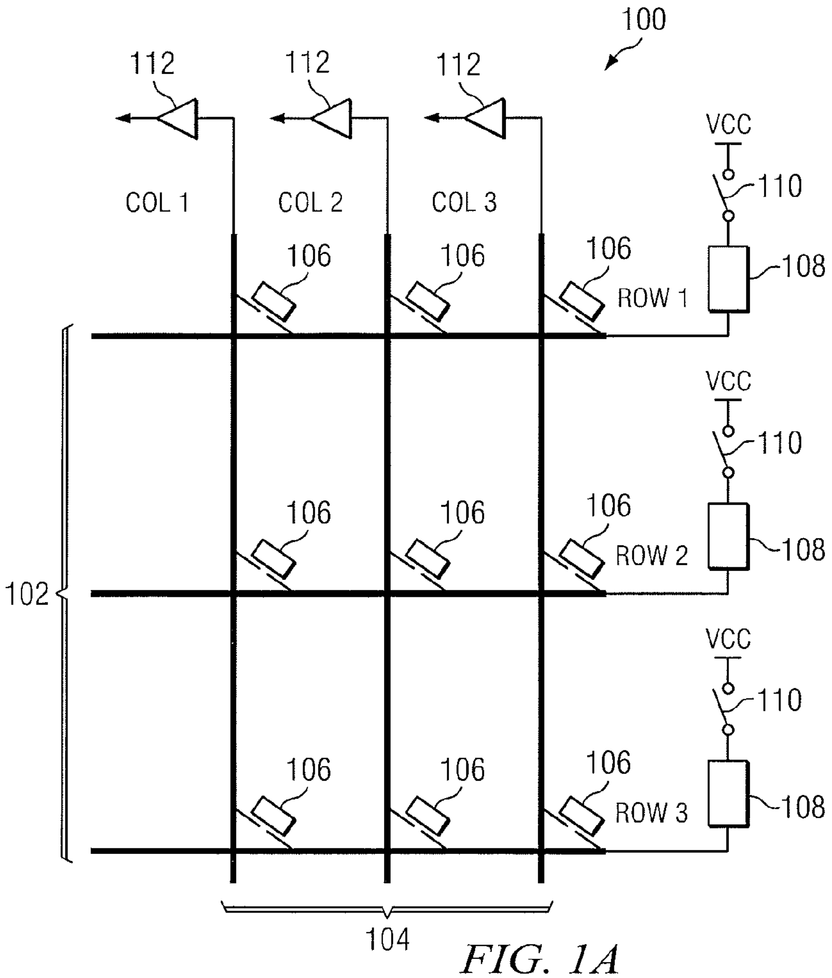
FIGS. 1A and 1B illustrate an example embodiment of conventional keypad circuitry and corresponding signal waveforms.

FIG. 1A illustrates an example embodiment of a conventional keypad circuit 100 for scanning a key matrix for a pressed key, wherein each key or, more specifically, the location of each key is defined by the corresponding row and column in which the key is located. It should be noted that within the present disclosure, scanning for a pressed key refers not to detecting that a key is pressed, but rather, to identifying which specific key is pressed. However, prior to scanning for a pressed key, a pressed key is detected. One example embodiment for detecting a key press may be found in U.S. Pat. No. 4,918,445, the disclosure of which is hereby incorporated by reference.

The keypad circuitry 100 in FIG. 1A comprises three rows 102 (Row1-Row3) and three columns 104 (Col1-Col3) of keys 106. Each row 102 includes pull-up circuitry 108 for driving the rows 102 to a logic high value during scanning, even when no key 106 is pressed, and a switch 110 for connecting the rows 102 to a supply voltage VCC during key scanning Each column 104 includes a buffer 112 for producing a column signal. Although it is not shown in FIG. 1A, the keypad circuitry 100 includes key-scanning circuitry operable to control the scanning process and to read, or detect, the signal transitions at each column 104 and row 102.

When no key 106 is pressed, each of the columns 104 are grounded and have a logic low value, and each of the rows 102 are forced to a logic high value by the pull-up circuitry 108. When a key 106 is pressed, the key 106 couples the row 102 in which the key 106 is located to the column 104 in which the key 106 is located. The rows 102 and columns 104 are then read, or scanned, to determine the location of (i.e., identify) the pressed key 106.

When the circuitry 100 in the embodiment shown in FIG. 1A is scanned to detect a pressed key 106, the switches 110 in each of the rows 102 are closed sequentially, thereby applying the voltage VCC to each of the rows 102. The voltages at the rows 102 therefore swing rail-to-rail from ground to VCC, thereby generating EMI. Additionally, since a pressed key 106 couples its corresponding row 102 to its corresponding column 104, when the switch 110 in the corresponding row 102 is closed, the voltage VCC is also applied to the column 104 corresponding to the pressed key 102, thereby resulting in a rail-to-rail voltage swing at the buffer 112 from 0V to VCC, thus generating even more EMI. When the voltage VCC is received at the buffer 112, the column signal is changed from a logic low value to a logic high value. Accordingly, a logic high column signal indicates that a key 106 located in that particular column 104 is pressed. The columns 104 or, more specifically, the column signals are then read to determine which column 104 corresponds to the pressed key 106. The pressed key 106 is then identified by the row 102 and column 104 detected during the scanning process. An example of the scanning process is further described below in accordance with the waveforms 150 illustrated in FIG. 1B.

Figure 1B:
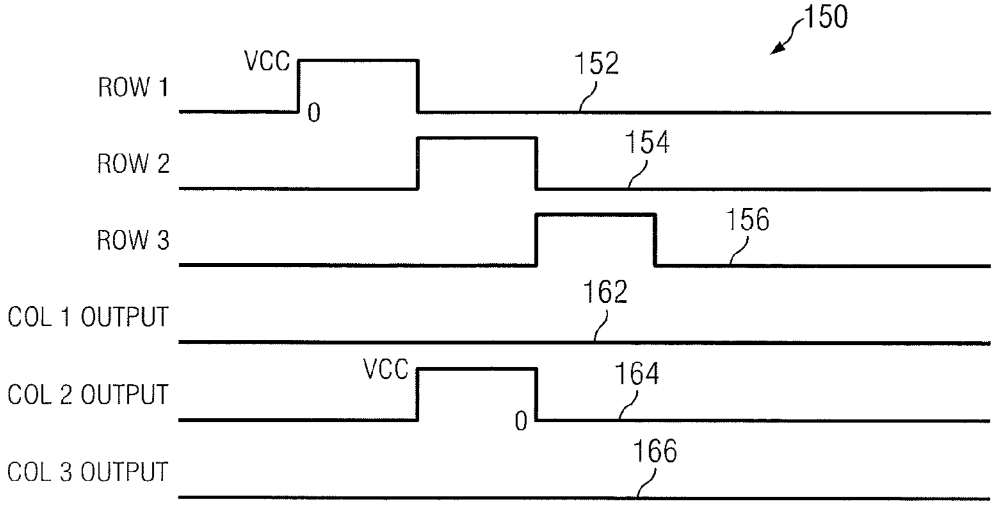

FIG. 1B is provided to illustrate the waveforms 150 during one example of scanning for a pressed key 106 in the keypad circuit 100 illustrated in FIG. 1A. When scanning for a pressed key 106, the switch 110 located in a row 102 is closed, and the columns 104 are read to determine if the pressed key 106 is located in the row 102 and columns 104 being read. This process is repeated for each row 102. Signals 152, 154, and 156 correspond to the voltages at Row1, Row2, and Row3, respectively, wherein each signal 152, 154, and 156 has a voltage of VCC when the switch 110 is closed and is grounded when the switch 110 is opened. Thus, when signal 152, 154, or 156 is high, the switch 110 is closed and the voltage at the respective row 102 is VCC; and when the signal 152, 154, or 156 is low, the switch 110 is open and the voltage at the respective row 102 is 0V. Accordingly, when the switches 110 are closed during the scanning process, a rail-to-rail voltage swing between 0V and VCC occurs at the rows 102, and signal transitions occur at each of the rows 102.

Column signals 162, 164, and 166 correspond to the signals at the column buffers 112 of Col1, Col2, and Col3, respectively, wherein each column signal 162, 164, and 166 has a logic high value when the buffer 112 receives the voltage VCC from the closed switch 110 corresponding to the row 102 of the pressed key 106, and a logic low value when the buffer 112 is grounded (i.e., the switch 110 is opened, or a key 106 in the respective column 104 is not pressed). Thus, when signal 162, 164, or 166 is high, the voltage at the respective column buffer 112 is VCC, and when signal 162, 164, or 166 is low, the voltage at the respective buffer 112 is 0V. Accordingly, a voltage swing occurring at the column 104 is a rail-to-rail swing between 0V and VCC. As shown in FIG. 1B, each switch 110 is closed in the sequence shown (Row1, Row2, and then Row3), and each column 104 is read to determine if the column signal 162, 164, or 166 is a logic high value. When the switch 110 at Row2 is closed, the Col2 signal 164 is logic high. As such, the signal waveforms 150 shown in FIG. 1B, indicate that the pressed key 106 is located in Row2 and Col2 (Row2-Col2).

In the example embodiment illustrated in FIGS. 1A and 1B, the voltage swings and signal transitions occurring during the scanning process generate electromagnetic interference (also known as radio frequency interference, or RFI). As such, it should be appreciated that for a key matrix having a larger number of keys, there may be an increase in the number of rows and/or columns. If the period of a key press remains unchanged, the scanning of the rows and columns may occur at a higher frequency, thereby resulting in a larger number of voltage swings and signal transitions generated during scanning, and a corresponding increase in the EMI generated. Therefore, the present disclosure provides keypad circuitry capable of performing a key scan while reducing EMI.

Figure 2A:
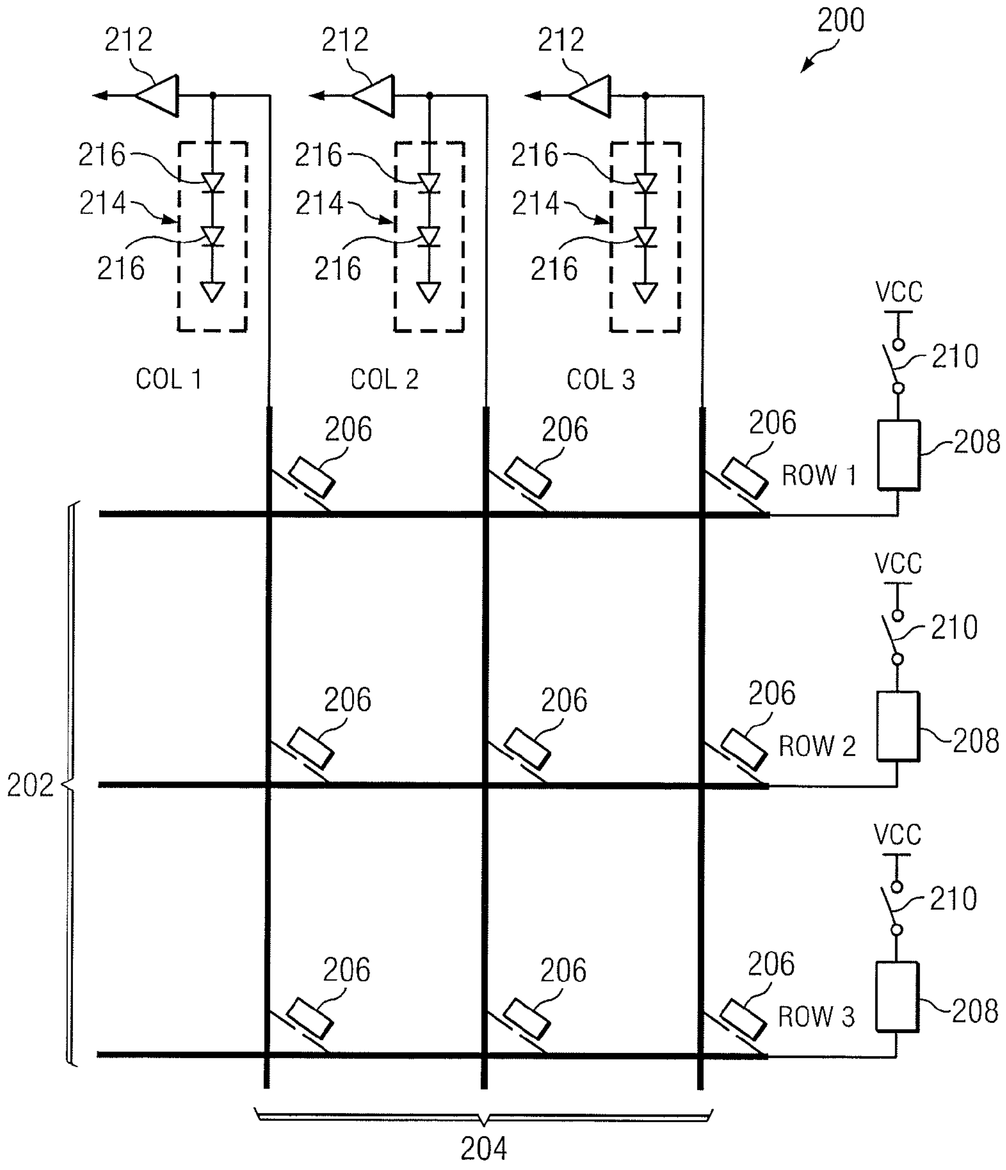
FIGS. 2A, 2B, and 2C illustrate keypad circuitry and corresponding signal waveforms of an embodiment of the present disclosure operable to reduce EMI by reducing the voltage swing occurring at both the row and column when applying a voltage to a row during key scanning.

FIG. 2A illustrates a first embodiment of the present disclosure, wherein keypad circuitry 200 is operable to reduce EMI by reducing the voltage swing occurring at both the row and column when applying the voltage VCC to a row during key scanning The keypad circuitry 200 illustrated in FIG. 2A comprises three rows 202 (Row1-Row3) and three columns 204 (Col1-Col3) of keys 206, wherein the rows 202 are orthogonal to the columns 204. Each row 202 includes pull-up circuitry 208 (e.g., a resistor or transistor) for driving the rows 202 to a logic high value when no key 206 is pressed and a switch 210 for connecting the rows 202 to a voltage supply VCC during key scanning Each column 204 includes a buffer 212 for outputting a column signal and voltage clamping circuitry 214 for clamping the voltage at the buffer 212. As shown in FIG. 2A, the voltage clamping circuitry 214 is comprised of two diodes 216 in series, however, it should be appreciated that other circuitry such as, for example, NMOS and PMOS transistors may be implemented to achieve the clamped voltage. Although it is not shown in FIG. 2A, the keypad circuitry 200 includes key-scanning circuitry operable to control the scanning process and to read, or detect, the signals at each row 202 and column 204.

During initialization of the keypad circuit 200, voltage VCC is applied to each of the rows 202 to obtain the normal operating state of the circuit 200. Once the circuit has stabilized and no key 206 is pressed, each of the columns 204 are grounded and have a logic low value. Additionally, each of the rows 202 have a logic high value, and a voltage equal to ground (0V) when the switch 210 is open, and a voltage equal to VCC when the switch 210 is closed. When a key 206 is pressed, the key 206 couples the row 202 in which the key 206 is located to the column 204 in which the key 206 is located, and the rows 202 and columns 204 are read, or scanned, to determine the location of the pressed key 206. It should be appreciated that, in some embodiments, the key-scanning circuitry may control operation of the switches 210 to perform a key scan even if no key 206 is pressed.

When scanning to detect a pressed key 206, the switches 210 in each of the rows 202 are closed sequentially, thereby applying the voltage VCC to the row 202. In this embodiment, the voltage swing at the row 202 of the pressed key 206 is reduced from a rail-to-rail swing between 0V and VCC (as in the circuit in FIG. 1A) to a reduced swing between 0V and 2*Vdiode. Additionally, since a pressed key 206 couples its corresponding row 202 to its corresponding column 204, when the switch 210 in the corresponding row 202 is closed, the voltage VCC is applied to the column 204 corresponding to the pressed key 206.

The clamping circuitry 214 clamps the voltage at the buffer 212 by providing a voltage divider. As such, the voltage swing at the column 204 is reduced from a rail-to-rail swing between 0V and VCC (as in the circuit in FIG. 1A) to a reduced swing between 0V and 2*Vdiode. When the clamped voltage 2*Vdiode is received at the buffer 212, the column signal is changed from a logic low value to a logic high value. The columns 204 or, more specifically, the column signals are then read to determine which column 204 corresponds to the pressed key 206. Since the key-scanning circuitry controls the closing of the switch 210, the row 202 corresponding to the detected logic high column signal is known. Therefore, the pressed key 206 is identified by the row 202 and column 204 corresponding to the pressed key 206 as detected during the key scanning process.

Figure 2B:
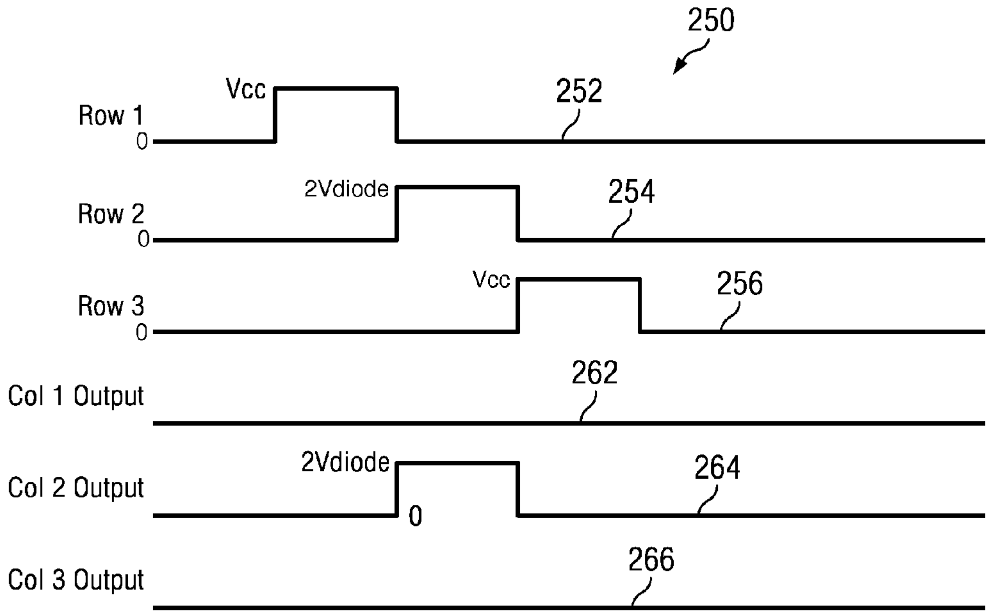

FIG. 2B illustrates the signal waveforms 250 corresponding to the rows 202 and columns 204 in the keypad circuit 200 during an embodiment of the key scanning process. The signal waveforms 250 in FIG. 2B include the row signals of each of the rows 202 (respective signals 252, 254, and 256) and the column signals of each of the columns 204 (respective signals 262, 264, and 266). Signals 252, 254, and 256 correspond to the voltages of Row 1, Row2, and Row3, respectively, wherein each signal 252, 254, and 256 has a logic high value when the switch 210 in the corresponding row 202 is closed, and a logic low value when the switch 210 is opened. Accordingly, when signal 252, 254, or 256 is high, the voltage at the respective row 202 is VCC if the key 206 corresponding to that row 202 is not pressed, and is 2*Vdiode if the key 206 corresponding to that row 202 is pressed. When signal 252, 254, or 256 is low, the voltage at the respective row 202 is 0V. As such, the voltage swing occurring at a row 202 having a pressed key 206 during the key scanning process is between 0V and 2*Vdiode. When compared to conventional keypad circuitry, the voltage swing at the row 202 is significantly reduced, thereby reducing EMI.

Column signals 262, 264, and 266 correspond to the signals at the column buffers 212 of Col1, Col2, and Col3, respectively, wherein each column signal 262, 264, and 266 has a logic high value when the buffer 212 receives the clamped voltage 2*Vdiode, and a logic low value when the buffer 212 is grounded (i.e., the switch 210 is opened, or a key 206 in the respective column 204 is not pressed). Accordingly, when signal 262, 264, or 266 is high, the voltage at the respective column buffer 212 is 2*Vdiode, and when signal 262, 264, or 266 is low, the voltage at the respective buffer 212 is 0V. As such, a voltage swing occurring at a column 204 is between 0V and 2*Vdiode. When compared to conventional keypad circuitry, the voltage swing at the column 204 is significantly reduced, thereby reducing EMI.

In the example embodiment shown in FIG. 2B, each switch 210 is closed in the sequence shown (Row1, Row2, and then Row3), and each column 204 is read to determine if the column signal 262, 264, or 266 is a logic high value. When the switch 210 at Row2 is closed, the Col2 signal 264 is logic high. As such, the signal waveforms 250 shown in FIG. 2B, indicate that the pressed key 206 is located in Row2 and Col2 (Row2-Col2).

Figure 2C:
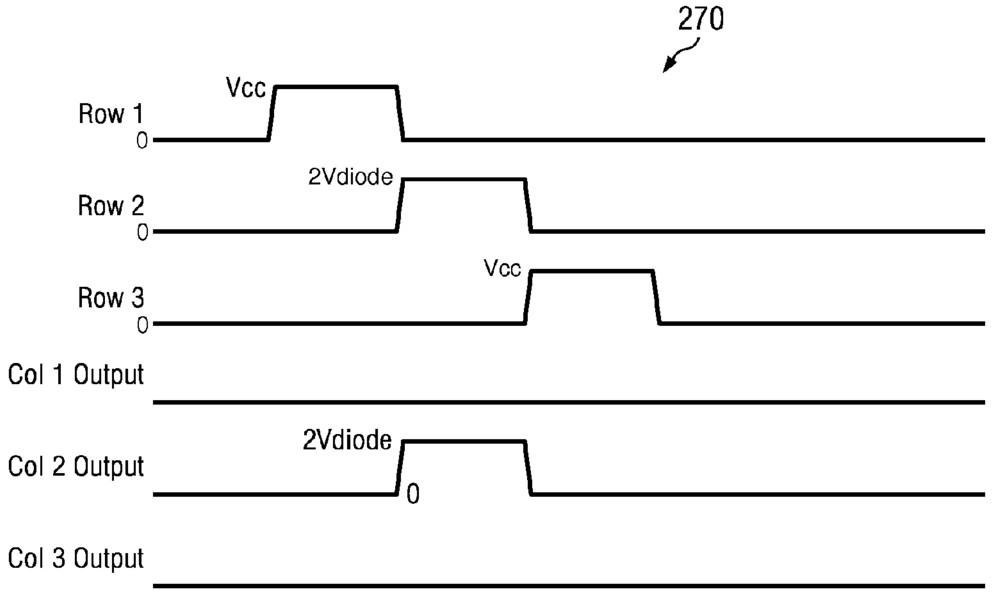

In some embodiments, the EMI of the keypad circuitry 200 shown in FIG. 2A may be further reduced by adjusting the pull-up circuitry 208 to allow for an increase in the slew rate of the signals. For example, if the pull-up circuitry 208 comprises a resistor, the slew rate may be increased by increasing the resistance of the pull-up circuitry 208. FIG. 2C illustrates example waveforms 270 corresponding to those shown in FIG. 2B, wherein the pull-up circuitry 208 is adjusted to allow for an increased slew rate.

Figure 3A:
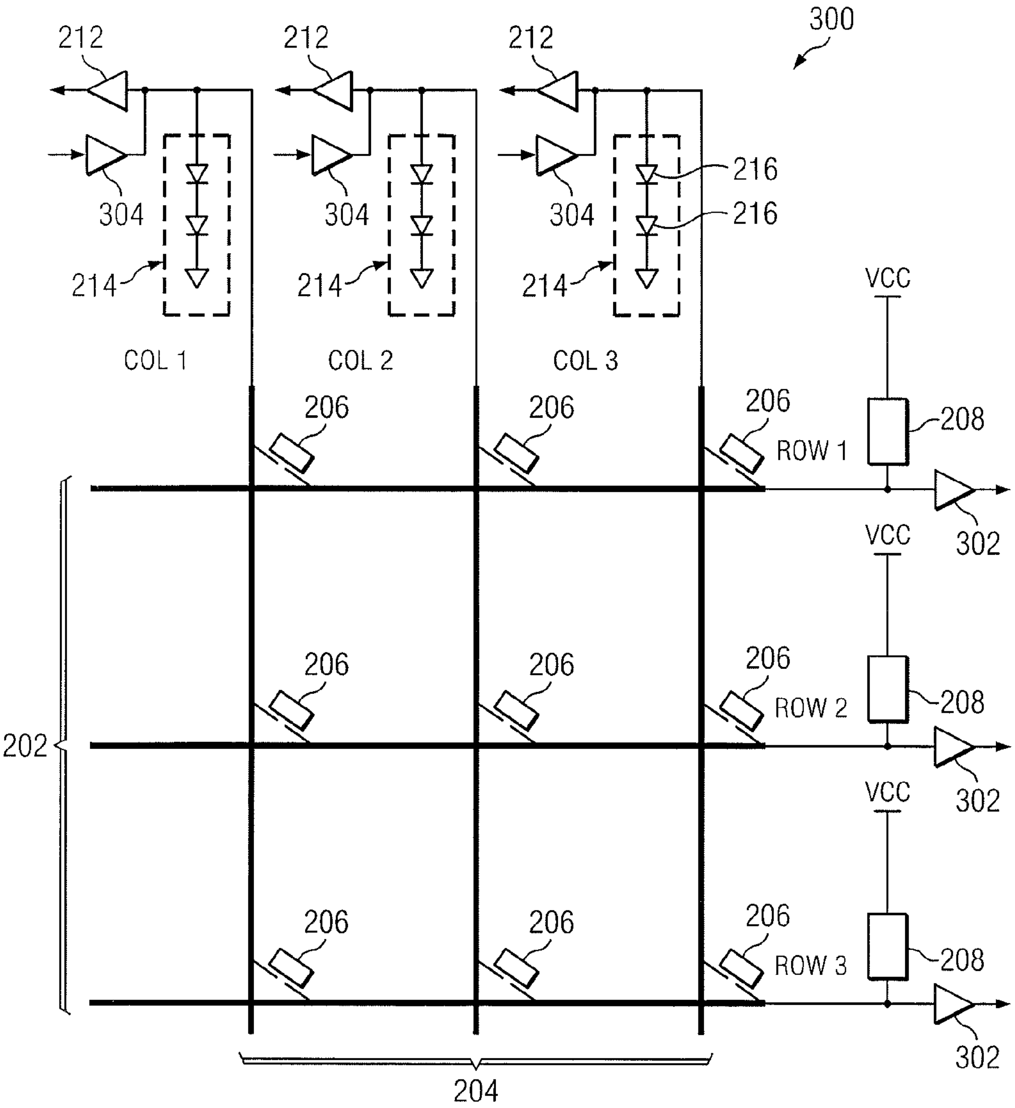
FIGS. 3A, 3B, and 3C illustrate keypad circuitry and corresponding signal waveforms of an embodiment of the present disclosure operable to reduce the number of signal transitions, thereby reducing EMI, by restricting the signal transitions to occurring at the column and row corresponding to a pressed key.

FIG. 3A illustrates another example embodiment of the present disclosure, wherein keypad circuitry 300 is operable to reduce EMI in two ways: a) reducing the voltage swing occurring at both the rows and columns, and b) reducing the number of signal transitions by restricting the signal transitions to occurring at the column and row corresponding to a pressed key. The keypad circuitry 300 provided in FIG. 3A is similar to that shown and described above in accordance with FIG. 2A, except that the switches 210 of the circuitry 200 in FIG. 2A are removed and the keypad circuitry 300 further comprises driving circuitry 304 coupled to each of the columns 204, and a row buffer 302 coupled to each of the rows 202 for providing a row signal. It should be appreciated that the keypad circuitry 300 illustrated in FIG. 3A further comprises key-scanning circuitry (not shown) operable to control the scanning process and to read the signals at each row 202 and column 204.

Figure 3B:
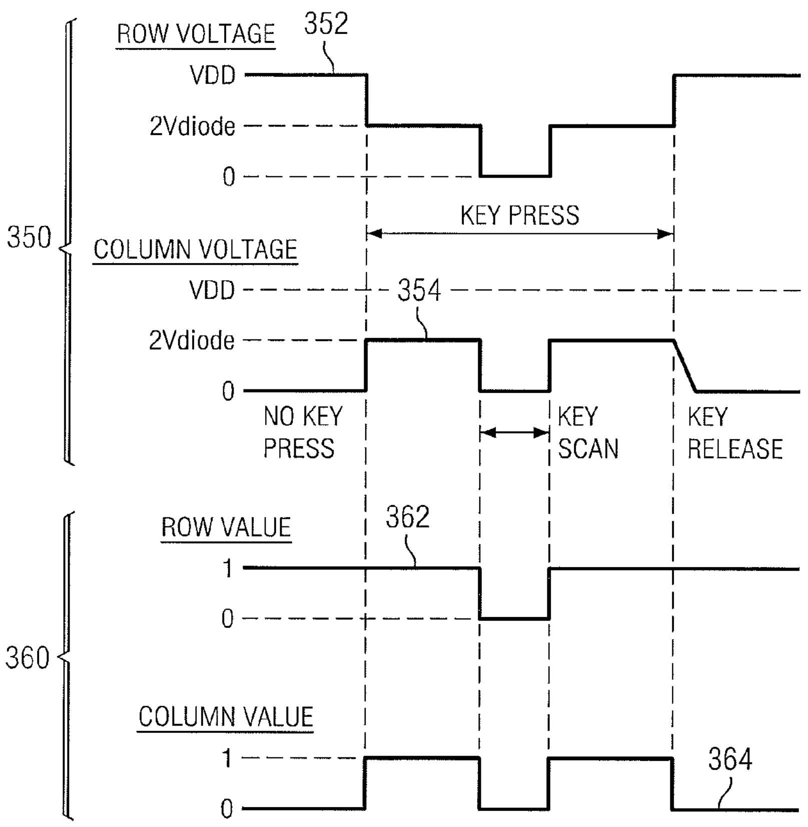

FIG. 3B illustrates waveforms corresponding to a row 202 and column 204 connected by a pressed key 206. The first set of waveforms 350 correspond to the voltages at the row 202 (signal 352) and column 204 (signal 354), and the second set of waveforms 360 correspond to the logic values at the respective row 202 (signal 362) and column 204 (signal 364). The columns 204 include pull-down circuitry (not shown), whereas the rows 202 comprise pull-up circuitry 208. Therefore, when no key 206 is pressed, each of the columns 204 have a logic low value with 0V at the column 204 and each of the rows 202 have a logic high value with a voltage of VCC at the row 202. When a key 206 is pressed, the corresponding row 202 and column 204 form a voltage divider network, whereby the voltage at the row 202 drops to 2*Vdiode, and the voltage at the column 204 increases to 2*Vdiode (see signals 352 and 354, respectively). Since the pull-up circuitry 208 of the rows 202 is stronger than the pull-down circuitry of the columns 204, the column 204 is pulled to a logic high value and the row 202 remains logic high (see signals 364 and 362, respectively).

Once the key-scanning circuitry detects the logic high value on the column signal 364, the key-scanning circuitry initiates a key-scan cycle, or key-scanning mode, whereby the driver circuitry 304 drives the selected column 204 to a logic low value (see signal 364). Since the pressed key 206 shorts the row 202 and column 204, the driver circuitry 304 overrides the pull-up circuitry 208 on the corresponding row 202, thereby driving the row 202 to a logic low value (see signal 362). As such, both the column 204 and the row 202 have a logic low value (see signals 362 and 364) and a voltage of 0V (see signals 352 and 354) during the key-scan cycle.

The row 202 having the logic low value enables the key-scanning circuitry to decode the key coordinates. In some embodiments, this process includes saving the key data into a de-bouncer buffer, confirming if the key press is valid, and updating key data in the key-scanning circuitry. In some embodiments, the key-scanning circuitry may continue to poll while the key 206 remains pressed, and may be reinitialized when the key 206 is released. When the circuitry is reinitialized, the pull-up circuitry 208 pulls the row voltage to VDD, and the clamping circuitry 214 discharges the column 204 to 0V.

Referring again to FIG. 3B, once the key-scan cycle is complete (and the key 206 remains pressed), the voltage at the row 202 and column 204 returns to 2*Vdiode, and the logic values of the row 202 and column 204 (see signals 362 and 364, respectively) return to a logic high value. When the key 206 is released, the voltage at the row 202 returns to VDD (see 352) and the voltage at the column 204 returns to 0V (see 354). Accordingly, the logic value of the row 202 remains a logic high value (see 362) and the logic value of the column 204 returns to a logic low value (see 364). The signal waveforms 350 illustrate that the voltage swing occurring at a row 202 or column 204 is between 0V and 2*Vdiode, or between 2*Vdiode and VCC. Accordingly, the keypad circuitry 300 in FIG. 3A reduces EMI by reducing the voltage swing occurring at a column 204 and row 202 corresponding to a pressed key 206.

Figure 3C:
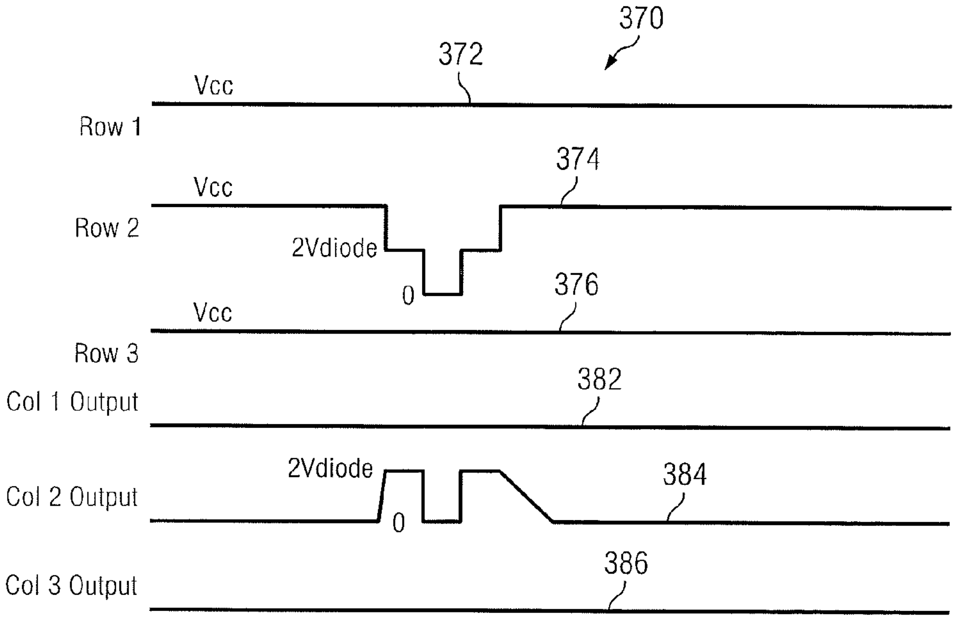

FIG. 3C illustrates the signal waveforms 370 corresponding to the rows 202 and columns 204 in the keypad circuit 300 during an embodiment of the key scanning process when the key 206 located at Row2-Col2 is pressed. The signal waveforms 370 in FIG. 3C illustrate the voltages at each of the rows 202 and each of the columns 204. Signals 372, 374, and 376 correspond to the signal transitions at each of Row1, Row2, and Row3, respectively, and signals 382, 384, and 386 correspond to the signal transitions at each of Col1, Col2, and Col3, respectively. As shown in FIG. 3C, when performing the key-scan process, the voltage, and thus, the output signal, for any row 202 or column 204 only changes when the respective column 204 or row 202 corresponds to the pressed key 206. For example, since the embodiment illustrated in FIG. 3C corresponds to the key 206 located in Row2-Col2 being pressed, row signals 372 and 376, and column signals 382 and 386, do not contain signal transitions during the key-scanning process, whereas signal transitions occur on row signal 374 and column signal 384. The signal waveforms 370 illustrate that the keypad circuitry 300 in FIG. 3A reduces the number of signal transitions by restricting the signal transitions to occurring at the column 204 and row 202 corresponding to a pressed key 206. Accordingly, the circuitry 300 in FIG. 3A reduces the EMI by a) reducing the voltage swing on the row 202 and column 204 corresponding to the pressed key 206, and b) reducing the number of signal transitions.

Figure 4A:
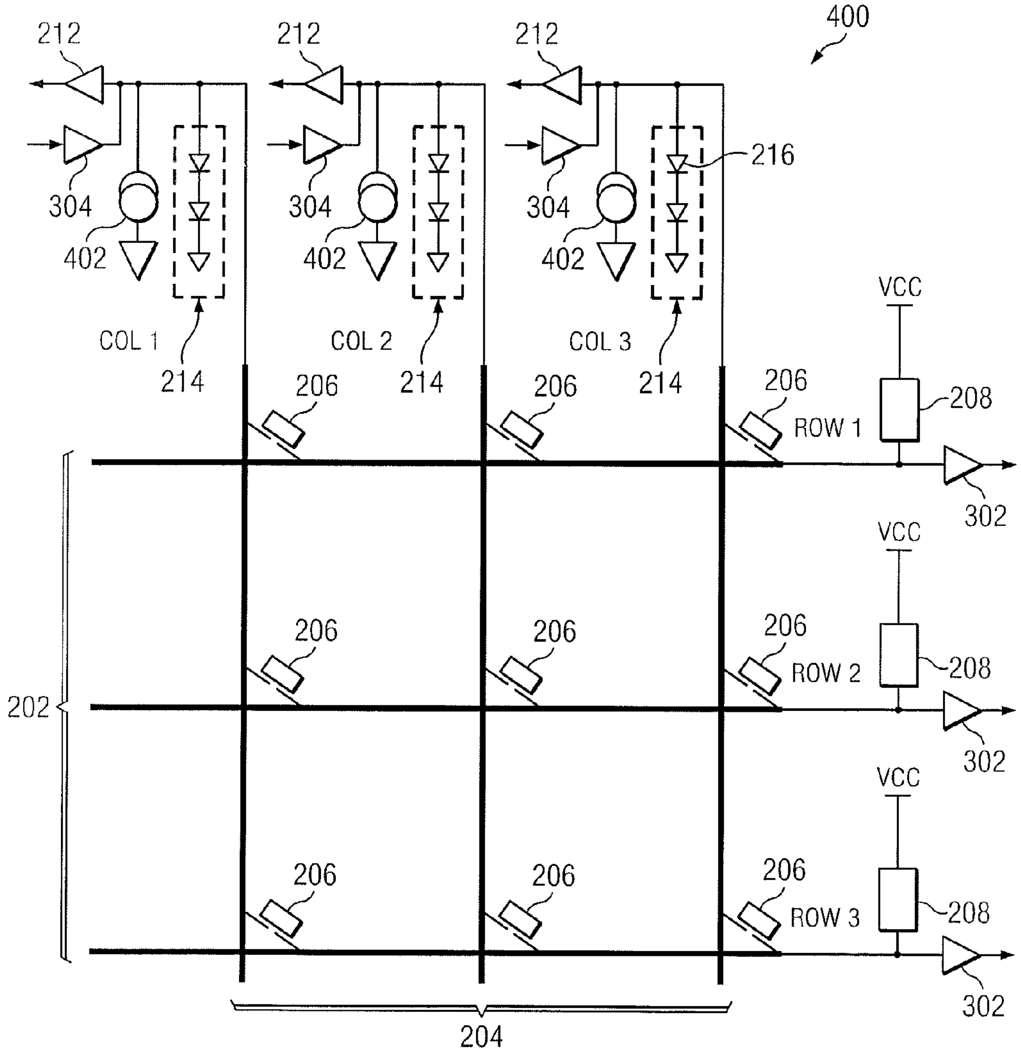
FIGS. 4A and 4B illustrate keypad circuitry and corresponding signal waveforms of an embodiment of the present disclosure similar to that shown in FIG. 3A and further comprising current sources for providing a faster discharge of the columns.
Figure 4B:
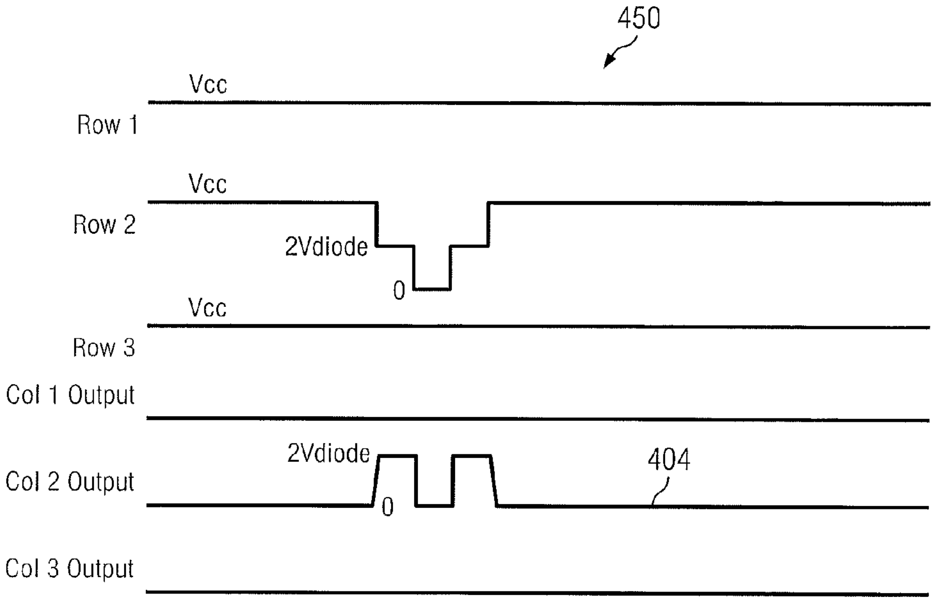

FIG. 4A illustrates an example embodiment 400 of the present disclosure wherein the keypad circuitry shown in FIG. 3A further includes current sources 402 coupled to the columns 204. FIG. 4B illustrates the waveforms 450 corresponding to the embodiment 400 illustrated in FIG. 4A. As shown by column signal 404, the current sources 402 provide a faster discharge of the columns 204 when transitioning from 2*Vdiode to ground when the pressed key 206 is released.

Figure 5A:
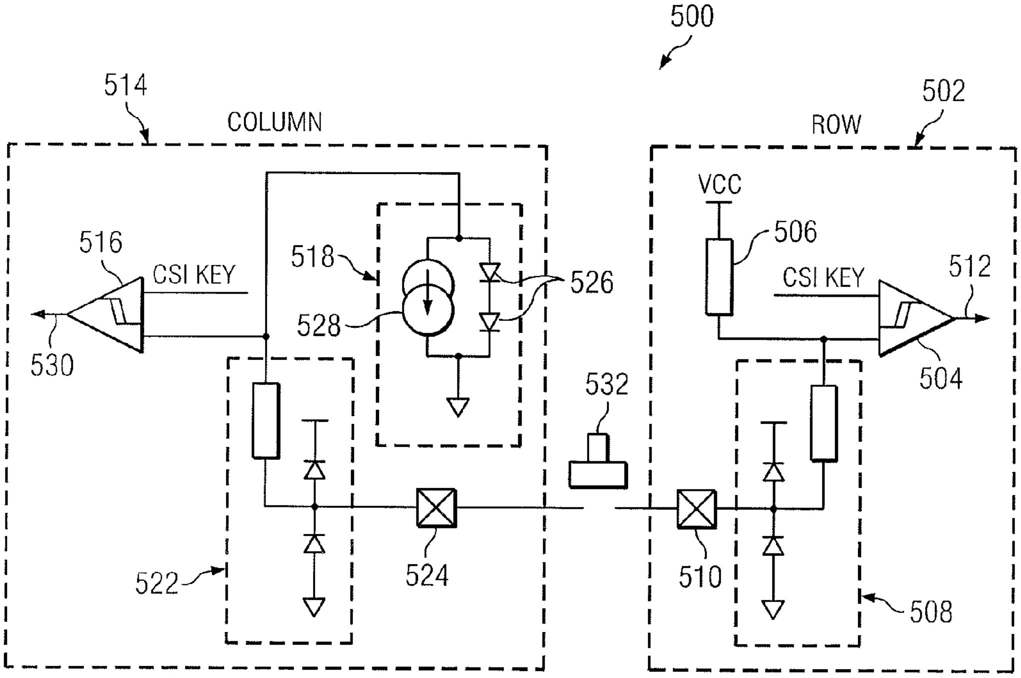
FIGS. 5A, 5B, and 5C illustrate detailed keypad circuitry for a row and column in accordance with an embodiment of the present disclosure.
Figure 5B:
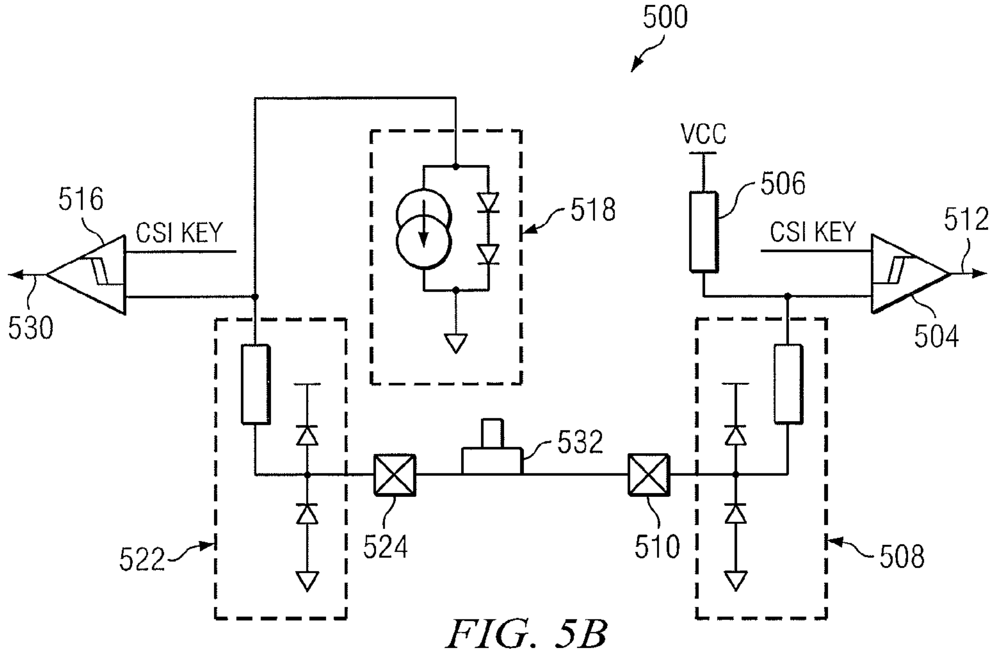
Figure 5C:
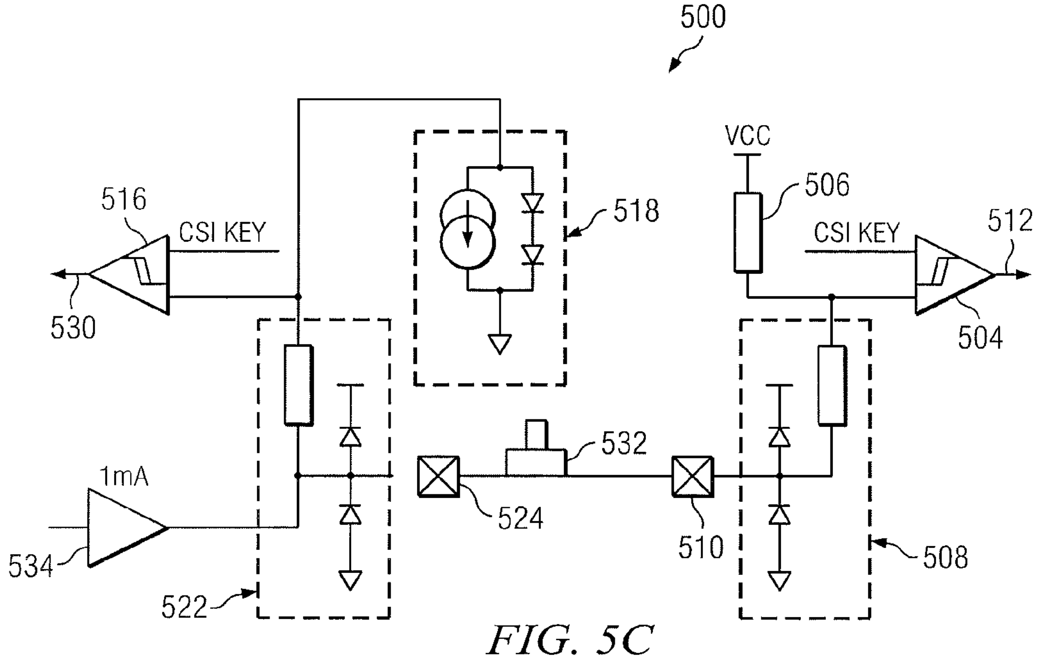

FIGS. 5A, 5B, and 5C provide a more detailed illustration of keypad circuitry 500 for a row and column in accordance with an embodiment of the present disclosure. The keypad circuitry 500 includes row circuitry 502 receiving a voltage VCC, wherein the row circuitry 502 comprises a row buffer 504, pull-up circuitry 506, electrostatic discharge protection circuitry 508, and a row pad 510. The row circuitry 502 supplies a row output signal 512, which is read by the key-scanning circuitry (not shown). The keypad circuitry 500 also includes column circuitry 514 comprising a column buffer 516, voltage clamping circuitry 518, electrostatic discharge protection circuitry 522, and a column pad 524. In the embodiment illustrated in FIGS. 5A, 5B, and 5C, the voltage clamping circuitry 518 is comprised of two diodes 526 and a current source 528, thereby clamping the voltage at the column to 2*Vdiode. The column circuitry 514 supplies a column output signal 530, which is read by the key-scanning circuitry. The keypad circuitry 500 also includes a key 532 operable to facilitate an electrical connection between the row pad 510 and the column pad 524 when the key 532 is pressed, thereby coupling the row circuitry 502 to the column circuitry 514.

The embodiment in FIG. 5A illustrates the keypad circuitry 500 when the key 532 is not pressed. In accordance with the foregoing disclosure, the row signal 512 is a logic high value, and has a voltage of VDD, whereas the column signal 530 is grounded with a logic low value.

The embodiment in FIG. 5B illustrates the keypad circuitry 500 when the key 532 is pressed, but prior to (or after) key scanning In FIG. 5B, the key 532 provides a connection between the row pad 510 and the column pad 524, thereby forming a voltage divider network, whereby the voltage at the row drops to 2*Vdiode, and the voltage at the column increases to 2*Vdiode. The pull-up circuitry 506 pulls the column signal 530 to a logic high value and the row signal 512 remains logic high.

The embodiment in FIG. 5C illustrates the keypad circuitry 500 when the key 532 is pressed and the key-scanning circuitry is performing a key scan. During key scanning, driving circuitry 534 drives the voltages at the column and row to ground. Additionally, the driving circuitry 534 forces the column signal 530 to a logic low value, and overrides the pull-up circuitry 506, thereby also driving the row signal 512 to a logic low value. As such, both the column signal 530 and the row signal 512 have a logic low value and a voltage of 0V during the key-scan cycle. In accordance with the foregoing disclosure, the key 532 is identified by the column and row corresponding to the logic low column signal 530 and logic low row signal 512.

It should be appreciated that the disclosed embodiments are merely provided as examples for implementing keypad circuitry capable of detecting a pressed key while reducing electromagnetic interference. As such, alterations and adaptations may be made to the disclosed circuitry without departing from the spirit and scope of the disclosure as set forth in the claims below. For example, the row circuitry and column circuitry may be interchangeable. Therefore, the driving circuitry or clamping circuitry may, in some embodiments, be coupled to the row circuitry, rather than the column circuitry.

What is claimed is:

1. Keypad circuitry comprising:

a plurality of first signal lines;

a plurality of second signal lines crossing the plurality of first signal lines;

a plurality of keys, each key configured to connect one of the first signal lines to one of the second signal lines;

a clamping circuit coupled to each of the first signal lines and configured to apply, when one of the plurality of keys is pressed, a clamped voltage to the first and second signal lines connected by the key press, wherein during a non-scanning mode, a voltage at the connected first signal line transitions from a first voltage to the clamped voltage; and a drive circuit coupled to each of the first signal lines, wherein during a scanning mode, the drive circuit drives the voltage at the connected first signal line from the clamped voltage to the first voltage.

2. The keypad circuitry as set forth in claim 1, wherein during the non-scanning mode, a value at the connected second signal line is a first value, and a value at the connected first signal line transitions from a second value to said first value.

3. The keypad circuitry as set forth in claim 2, wherein during the scanning mode, said value at the connected second signal line and said value at the connected first signal line transition from said first value to said second value.

4. The keypad circuitry as set forth in claim 3, wherein said pressed key is identified by said connected first and second signal lines having said second value during said scanning mode.

5. The keypad circuitry as set forth in claim 1, wherein said first voltage is less than said clamped voltage.

6. The keypad circuitry as set forth in claim 1, wherein during the non-scanning mode, a voltage at the connected second signal line transitions from a third voltage to said clamped voltage.

7. The keypad circuitry as set forth in claim 6, wherein said third voltage is greater than said clamped voltage.

8. The keypad circuitry as set forth in claim 1, further comprising a buffer coupled to each of the first signal lines.

9. The keypad circuitry as set forth in claim 1, further comprising a buffer coupled to each of the second signal lines.

10. The keypad circuitry as set forth in claim 1, wherein when a first signal line is not connected to a second signal line, said first signal line is grounded, and said second signal line receives a supply voltage.

11. The keypad circuitry as set forth in claim 1, wherein said clamping circuit comprises one or more diodes.

12. The keypad circuitry as set forth in claim 1, wherein said clamping circuit comprises one or more transistors.

13. The keypad circuitry as set forth in claim 1, wherein said clamping circuit includes a current source.

14. The keypad circuitry as set forth in claim 1, wherein the plurality of second signal lines are orthogonal to the plurality of first signal lines.

15. The keypad circuitry as set forth in claim 1, wherein the drive circuit drives the voltage at the connected first signal line by driving a value of the connected first signal line from a logic high state to a logic low state.

16. Keypad circuitry comprising:

a plurality of first signal lines;

a plurality of second signal lines crossing the plurality of first signal lines;

a plurality of keys, each key operable to connect one of the first signal lines to one of the second signal lines;

a clamping circuit coupled to each of the first signal lines and operable, when one of the plurality of keys is pressed, to apply a clamped voltage to the first and second signal lines connected by the key press;

a drive circuit coupled to each of the first signal lines, wherein during a scanning mode, the drive circuit drives a voltage at the connected first signal line from the clamped voltage to a first voltage; and key-scanning circuitry operable to identify the pressed key, wherein the pressed key is identified by the connected first and second signal lines having the first voltage during the scanning mode.

17. Keypad circuitry comprising:

columns of signal lines;

rows of signal lines crossing the columns of signal lines;

a plurality of keys, each key configured to connect one of the column signal lines to one of the row signal lines; and clamping circuitry coupled to the column signal lines and configured to apply, when one of the plurality of keys is pressed, a clamped voltage to the column and row signal lines connected by the key press, wherein when the key is pressed, the connected column signal line transitions from ground to the clamped voltage, and the row signal line transitions from a supply voltage to the clamped voltage; and drive circuitry coupled to the column signal lines and operable during a first mode to drive a value of the column and row signal lines connected by the key press.

18. The keypad circuitry as set forth in claim 17, wherein driving the value of the column and row signal lines connected by the key press includes driving a voltage at the connected column and row signal lines from the clamped voltage to a drive voltage.

19. The keypad circuitry as set forth in claim 18, wherein the drive voltage is less than the clamped voltage.

20. The keypad circuitry as set forth in claim 18, wherein the drive voltage is ground.

21. The keypad circuitry as set forth in claim 17, wherein the first mode is a scanning mode.

22. The keypad circuitry as set forth in claim 17, wherein when a column signal line is not connected to a row signal line, the column signal line is grounded, and the row signal line receives a supply voltage.

23. A method for detecting a key press in a keypad circuit, the method comprising:

grounding columns of signal lines;

applying a supply voltage to rows of signal lines crossing the columns of signal lines;

connecting one of the columns of signal lines to one of the rows of signal lines when one of a plurality of keys are pressed;

applying a clamped voltage to the column signal line and the row signal line connected by the pressed key;

driving a voltage at the connected column and row signal lines from the clamped voltage to a drive voltage, wherein the drive voltage is less than the clamped voltage; and identifying the pressed key by the connected column and row signal lines having the drive voltage during a first mode.

24. The method as set forth in claim 23, wherein the clamped voltage is less than the supply voltage.

25. The method as set forth in claim 23, wherein the drive voltage is ground.

26. The method as set forth in claim 23, wherein the first mode is a key scanning mode.

* * * * *